(12) United States Patent
Dennis et al.

(10) Patent No.: US 6,472,307 B1
(45) Date of Patent: Oct. 29, 2002

(54) METHODS FOR IMPROVED ENCAPSULATION OF THICK METAL FEATURES IN INTEGRATED CIRCUIT FABRICATION

(75) Inventors: Donald C. Dennis; Nace Layadi; Simon J. Molloy; Kurt G. Steiner; Sylvia W. Thomas, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/491,644

(22) Filed: Jan. 27, 2000

(51) Int. Cl.[7] .............................................. H01L 21/316
(52) U.S. Cl. ......................... 438/624; 438/639; 438/702
(58) Field of Search ................................ 438/624, 639, 438/702, 763, FOR 355, FOR 458

(56) References Cited

U.S. PATENT DOCUMENTS

| | | | |
|---|---|---|---|
| 5,851,603 A | * | 12/1998 | Tsai et al. |
| 6,153,543 A | * | 11/2000 | Chesire et al. |
| 6,203,863 B1 | * | 3/2001 | Liu et al. |
| 6,228,780 B1 | * | 5/2001 | Kuo et al. |
| 6,239,018 B1 | * | 5/2001 | Liu et al. |
| 6,271,119 B1 | * | 8/2001 | Kishimoto |

* cited by examiner

Primary Examiner—George Fourson
Assistant Examiner—Joannie Adelle Garcia

(57) ABSTRACT

The present invention provides a method of manufacturing an integrated circuit having a capping layer over a thick metal feature. In one embodiment, the method comprises forming first and second oxide layers over the thick metal feature, forming a composite oxide layer including an oxide spacer by etching the first and second oxide layers, and forming a capping layer over the composite oxide layer. More specifically, forming the first oxide layer involves using a high density plasma (HDP) process, forming the second oxide layer involves using a plasma enhanced chemical vapor deposition (PECVD) process, and forming the composite oxide layer preferably involves etching with a reactive ion etch.

30 Claims, 5 Drawing Sheets

METHODS FOR IMPROVED ENCAPSULATION OF THICK METAL FEATURES IN INTEGRATED CIRCUIT FABRICATION

TECHNICAL FIELD OF THE INVENTION

The present invention is directed, in general, to semiconductor manufacturing and, more specifically, to a method for capping high aspect ratio metal features in integrated circuit fabrication.

BACKGROUND OF THE INVENTION

It has recently become desirable to incorporate inductors into sub-micron integrated circuit devices. In the fabrication of such integrated circuits, the inductor is typically formed at the final metal level, the metal layer is much thicker, e.g., 3000 nm, than the standard metal layers, e.g., 500 nm, that serve as device interconnects. Thicker metal layers, e.g., aluminum, are used for the inductor level because higher inductance can be achieved with the thicker metal. Of course, metals other than aluminum, such as copper, etc., may also be used in the future.

As inter-device distances are forced ever smaller, because of market pressures to make faster integrated circuits, these thicker metal layers result in features with a high aspect ratio with respect to inter-device distances. For example, with a feature as thick as 3000 nm the inter-device distance may be as small as 2000 nm. As is customary before final encapsulation, these metal features must be covered with a capping material, often comprising silicon dioxide ($SiO_2$) and silicon nitride (SiN) layers. The coverage of the SiN layer is especially important because a continuous layer is needed on both horizontal and vertical surfaces of the metal features to prevent moisture from penetrating the device and corroding the metal. Of course, the deposition of the capping layer must result in a low compressive stress to avoid stress migration or electromigration.

Conventional capping methods for metal features use a high density plasma (HDP) oxide deposition followed by a plasma enhanced chemical vapor deposition (PECVD) of SiN. One who is skilled in the art recognizes that HDP and PECVD processes result in markedly different deposition profiles. Referring initially to FIG. 1, illustrated is a partial sectional view of a simplified conventional integrated circuit 100 having thick metal features 110, 120 atop an intermediate dielectric layer 130, an oxide layer 140 deposited by HDP and a nitride layer 150. The thick metal features 110, 120 may also be referred to as high aspect ratio features 110, 120. During deposition, the HDP oxide 140 deposits sufficiently in the space or trench 160 between adjacent thick metal features 110, 120 at a thickness 145 approximately equal to a thickness 115 of the HDP oxide atop the thick metal features 110, 120. However, the HDP oxide 140 is not conformal to the semiconductor topography, but deposits as shown, and therefore provides relatively little coverage of near-vertical surfaces 112, 122 and shoulders 113, 123 of the high aspect ratio features 110, 120, respectively. The SiN layer 150 is shown as it would be deposited by a PECVD process over the oxide layer 140.

It should be understood that it is highly desirable to have as much of the trench 160 filled by dielectric material before the integrated circuit 100 is subjected to a final packaging step. During packaging, a molding compound (not shown) is injected under pressure to fill any remaining voids and could induce stresses in the thick metal features 110, 120. Variation in trench 160 fill or dielectric properties caused by molding packaging would have adverse effects on the electrical performance of circuits using thick metal inductors. With the HDP deposition as shown in FIG. 1, the oxide layer 140 coverage over shoulders 113, 123 would be of an inadequate thickness 114, 124, respectively, while adequately filling the trench 160. One effort to resolve this problem attempted to deposit up to 3000 nm of oxide 140 over thick metal features 110, 120 of 3000 nm height so as to completely fill the trench 160. This resulted in stresses so great that the wafer (not shown) was severely warped, and the integrated circuits unuseable.

Referring now to FIGS. 2A and 2B, illustrated are partial sectional views of a simplified conventional integrated circuit 200 having thick metal features 210, 220 atop an intermediate dielectric layer 230, an oxide layer 240 deposited by PECVD, and a nitride layer 250. Deposition of the oxide layer 240 by PECVD results in a "mushrooming" of the oxide around the thick metal features 210, 220. In some extreme cases, reentrant surfaces 243 (FIG. 2A) or even voids 245 (FIG. 2B) may form. Of course, manufacturing defects such as these are unacceptable. The subsequent capping layer 250 of SiN would be formed as shown. Therefore, referring to both FIGS. 1 and 2, it is clear that neither HDP nor PECVD deposition of the oxide layer 130, 230, respectively, forms a satisfactory basis for the capping layer 150, 250.

Accordingly, what is needed in the art is a method of forming an oxide/nitride capping layer over high aspect ratio metal features that assures adequate oxide and nitride thicknesses, especially over the feature shoulders.

SUMMARY OF THE INVENTION

To address the above-discussed deficiencies of the prior art, the present invention provides a method of manufacturing an integrated circuit having a capping layer over a thick metal feature. In one embodiment, the method comprises forming first and second oxide layers over the thick metal feature, forming a composite oxide layer including an oxide spacer by etching the first and second oxide layers, and forming a capping layer over the composite oxide layer. More specifically, forming the first oxide layer involves using a high density plasma (HDP) process, forming the second oxide layer involves using a plasma enhanced chemical vapor deposition (PECVD) process, and forming the composite oxide layer preferably includes etching with a reactive ion etch.

Thus, in a broad sense, the present invention provides a method for forming a spacer of an oxide so that a greater thickness of oxide smooths the transition from an upper surface of a thick metal feature to the side of the thick metal feature. The formation of the spacer facilitates formation of a capping layer over the oxide layer.

In another embodiment, the method includes forming the first oxide layer using an HDP process having a first deposition-to-sputter ratio. In one particular aspect of this particular embodiment, the method includes forming a first oxide layer using a first deposition-to-sputter ratio of about 4.5. Further, the method may comprise forming a third oxide layer on the first oxide layer prior to forming the second oxide layer. The formation of the third oxide layer may employ a second HDP process having a second deposition-to-sputter ratio. In a specific aspect of this embodiment, the method includes using an HDP process with a second deposition-to-sputter ratio of about 7.0. In other embodiments, the method includes forming first and third oxide layers of about 400 nm thickness.

The method, in yet another embodiment, includes forming a second oxide layer from a gas mixture including tetraethylorthosilicate and oxygen at a temperature ranging from about 250° C. to about 400° C. The process pressure may range from about 0.1 Torr to about 10 Torr and high frequency radiation may be applied ranging from about 200 kHz to about 13.56 MHz with a power ranging from about 100 Watts to about 2000 Watts. In a more specific aspect, the method includes forming a second oxide layer at a temperature of about 350° C., a pressure of about 4.0 Torr, and high frequency radiation of about 13.56 MHz with a power of about 1200 watts. The method may further include forming an oxide spacer having a base thickness ranging from about 40 percent to 60 percent of the thickness of the composite oxide layer. In a preferred aspect, the method includes forming an oxide spacer having a base thickness of about 50 percent of the thickness of the composite oxide layer.

In another embodiment, the method includes reactive ion etching with a gas mixture of trifluoromethane ranging from about 10 sccm to about 50 sccm, carbon tetrafluoride ranging from about 10 sccm to about 50 sccm, and argon ranging from about 50 sccm to about 250 sccm. The process pressure may range from about 50 mTorr to about 200 mTorr with power ranging from about 600 Watts to about 1200 Watts, and a magnetic field ranging from about 0 Gauss to about 40 Gauss. In a specific aspect, the method includes etching with a gas mixture of trifluoromethane at about 30 sccm, carbon tetrafluoride at about 30 sccm, and argon at about 60 sccm. The process pressure may be about 160 mTorr with a power of about 900 Watts, and a magnetic field of about 20 Gauss.

The method may further include forming the capping layer of silicon nitride using a PECVD process. In yet another embodiment, the method includes forming a second oxide layer having a refractive index of about 1.465 at $\lambda=633$ nm. In a further aspect, the method may include a thick metal feature of about 3000 nm thickness.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 3:
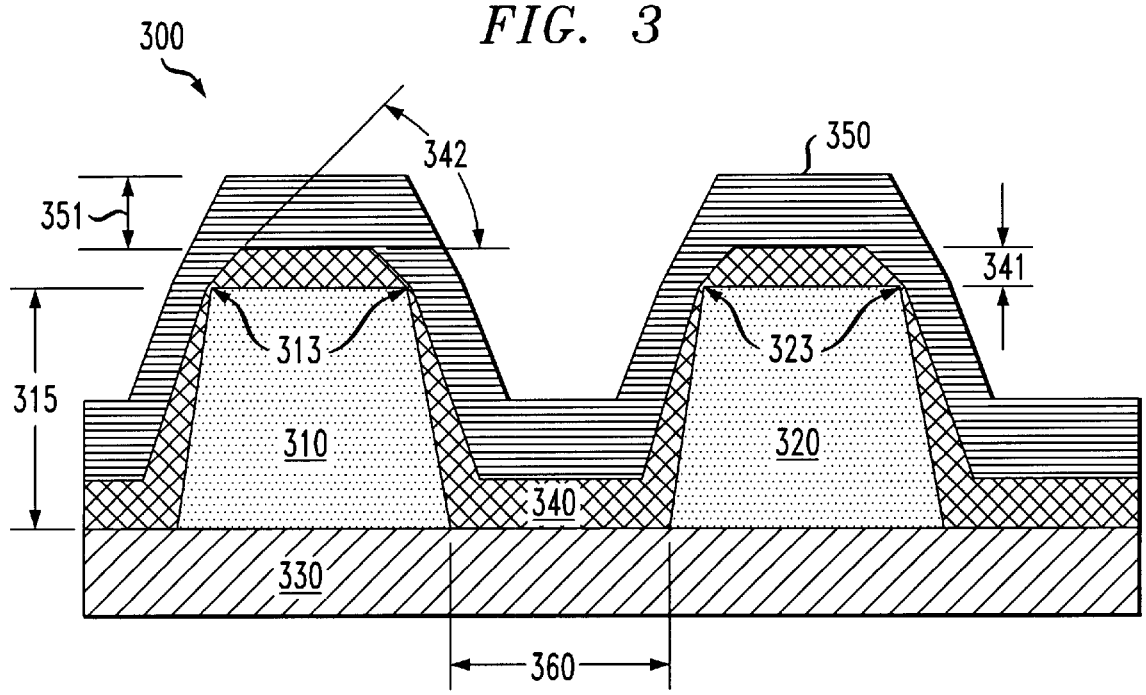
FIG. 3 illustrates a partial sectional view of one embodiment of an integrated circuit having thick metal features formed on an intermediate dielectric layer, and first and second oxide layers deposited according to the principles of the present invention.

Referring now to FIG. 3, illustrated is a partial sectional view of one embodiment of an integrated circuit 300 having thick metal features 310, 320, formed on an intermediate dielectric layer 330, and first and second oxide layers 340, 350 deposited according to the principles of the present invention. The thick metal features 310, 320, having a thickness 315 of about 3000 nm, may be inductors 310, 320 at a final metal level of the integrated circuit 300. The thick metal features 310, 320 are separated by a distance 360 of about 2000 nm.

The thick metal features 310, 320 are subjected to a high density plasma (HDP) process having a deposition-to-sputter etch ratio (d/s) of about 4.5 to form the first oxide layer 340 which may have a thickness 341 of about 800 nm. One who is skilled in the art is familiar with the details of an HDP process and understands that an angle 342 of deposition of the first oxide layer 340 is controlled by the reactor pressure, chemistry of the reaction, and the RF bias. These parameters also control the aforesaid deposition-to-sputter etch ratio.

The integrated circuit 300 is then subjected to a PECVD process to form the second oxide layer 350 to a thickness 351 of about 1000 nm. The PECVD process involves using a gas mixture including tetraethylorthosilicate (TEOS, that is: $Si(OC_2H_5)_4$) and oxygen ($O_2$) at a temperature ranging from about 250° C. to about 400° C. The process pressure may range from about 0.1 Torr to about 10 Torr. High frequency radiation ranging from about 200 kHz to about 13.56 MHz is applied with a power ranging from about 100 Watts to about 2000 Watts. In a highly advantageous embodiment, the integrated circuit 300 is subjected to a process temperature of about 350° C. and a pressure of about 4.0 Torr. The high frequency radiation with a power of about 1200 watts at about 13.56 MHz is used to dissociate the precursors in the atmosphere of TEOS and oxygen.

As can be seen in FIG. 3, the PECVD process results in a generally conformal deposition of the second oxide layer 350 over the first oxide layer 340. Additionally, these deposition conditions are optimized for improved coverage over shoulders 313, 323 with low compressive film stress from about 1E9 dyn/cm$^2$ to about 3E9 dyn/cm$^2$. The second oxide layer 350 has a refractive index of about 1.465 at $\lambda=633$ nm.

Figure 4:
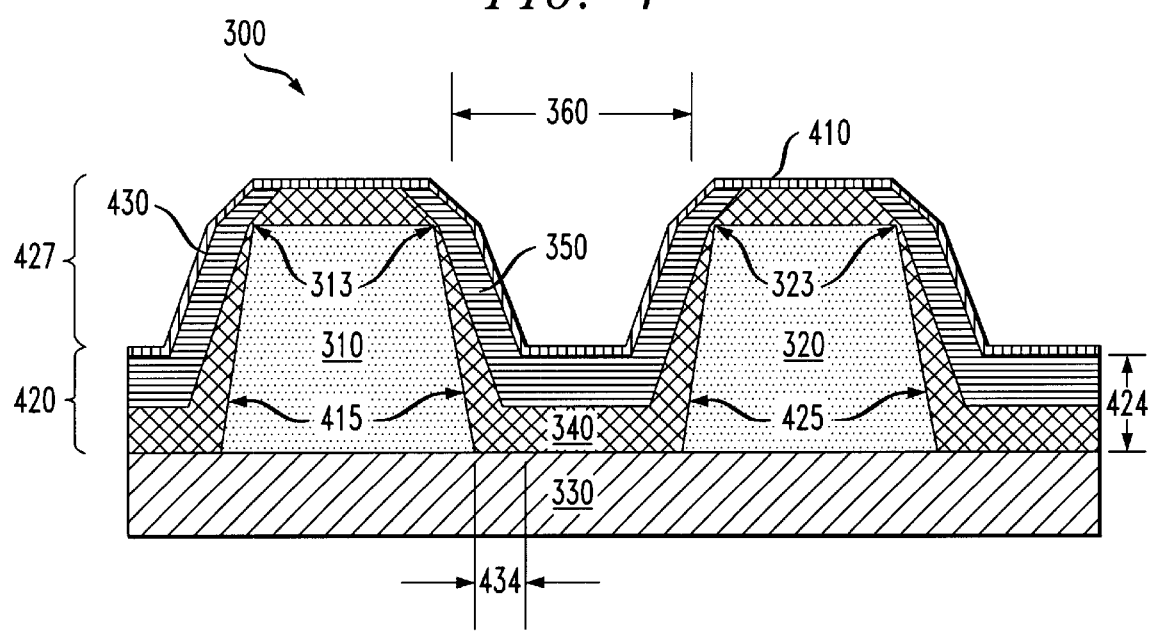
FIG. 4 illustrates a partial sectional view of the integrated circuit of FIG. 3 after a reactive ion etch (RIE) and deposition of a capping layer.

Referring now to FIG. 4 with continuing reference to FIG. 3, illustrated is a partial sectional view of the integrated circuit of FIG. 3 after a reactive ion etch (RIE) and deposition of a capping layer 410 in accordance with the principles of the present invention. The integrated circuit 300 is subjected to an anisotropic reactive ion etch with a gas mixture of trifluoromethane, carbon tetrafluoride and argon. The trifluoromethane concentration ranges from about 10 sccm to about 50 sccm, carbon tetrafluoride ranges from about 10 sccm to about 50 sccm, and the argon ranges from about 50 sccm to about 250 sccm. The process pressure is maintained in a range from about 50 mTorr to about 200 mTorr, with power ranging from about 600 Watts to about 1200 Watts, and a magnetic field ranging from about 0 Gauss to about 40 Gauss. In a particularly advantageous embodiment, the RIE comprises etching with a gas mixture of trifluoromethane at about 30 sccm, carbon tetrafluoride at about 30 sccm, and argon at about 60 sccm. The process pressure is maintained at about 160 mTorr with a power of about 900 Watts, and a magnetic field of about 20 Gauss.

The RIE removes about 1000 nm of oxide 350 so that the first oxide layer 340 is exposed atop the thick features 310, 320. The remaining portions of the first oxide layer 340 and the second oxide layer 350 may be termed a composite oxide layer 420. Because the etch is anisotropic, the etch does not remove the oxide 350 uniformly across the integrated circuit 300. At this relatively high process pressure, there is a low etch rate in the channel area 360 because of recombination. Therefore, a spacer 430, part of the composite oxide layer 420 and having a curved profile 427, remains adjacent each side 415, 425 of the thick features 310, 320, providing increased coverage of the shoulders 313, 323. The curved profile 427 of the spacer 430 provides a smoother, more continuous surface to which the capping layer 410 adheres.

The capping layer 410 may be formed as a nitride layer 410 by a conventional PECVD nitride deposition. Thus, one who is skilled in the art can see that better coverage of the shoulders 313, 323 with the composite oxide layer 420 provides a better surface for adherence of the nitride capping layer 410. In one embodiment, a base thickness 434 of the spacer 430 ranges from about 40 percent to 60 percent of the thickness 424 of the composite oxide layer 420. In a preferred embodiment, the base thickness 434 of the spacer 430 is about 50 percent of the thickness 424 of the composite oxide layer 420.

Figure 5:
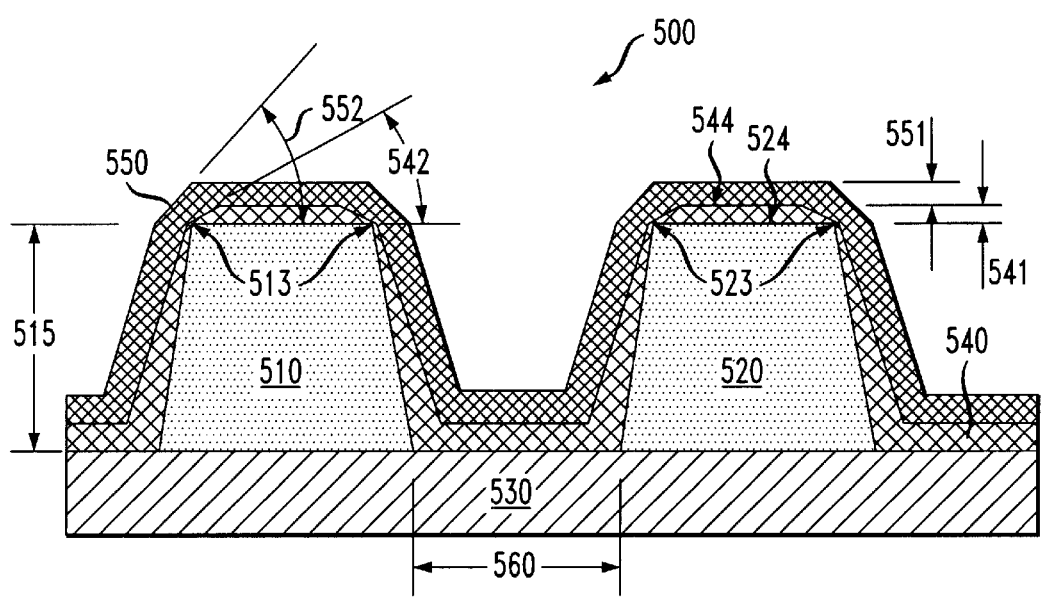
FIG. 5 illustrates a partial sectional view of an alternative embodiment of an integrated circuit having thick metal features an intermediate dielectric layer, a first oxide layer, and a third oxide layer deposited according to the principles of the present invention.

Referring now to FIG. 5, illustrated is a partial sectional view of an alternative embodiment of the present invention featuring an integrated circuit 500 having thick metal features 510, 520, an intermediate dielectric layer 530, a first oxide layer 540, and a third oxide layer 550. As above, the thick metal features 510, 520, having a thickness 515 of about 3000 nm, may be inductors 510, 520 at a final metal level of the integrated circuit 500. The thick metal features 510, 520 are separated by a distance 560 of about 2000 nm.

In this preferred embodiment, the first oxide layer 540 is formed to about a 400 nm thickness 541, using a first HDP process having a first d/s ratio of about 4.5. The third oxide layer 550 is formed over the first oxide layer 540 using a second HDP process having a second d/s ratio of about 7.0 to about 400 nm thickness 551. It should be noted that controlling the deposition-to-sputter ratio allows control of angles 542, 552, i.e., the higher deposition-to-sputter ratio of the third oxide layer 550 results in a greater angle 552 than the lower d/s ratio of the first oxide layer 540 that results in angle 542. Of course, the d/s ratio does not significantly affect the thickness deposition on horizontal surfaces 524, 544.

Figure 6:
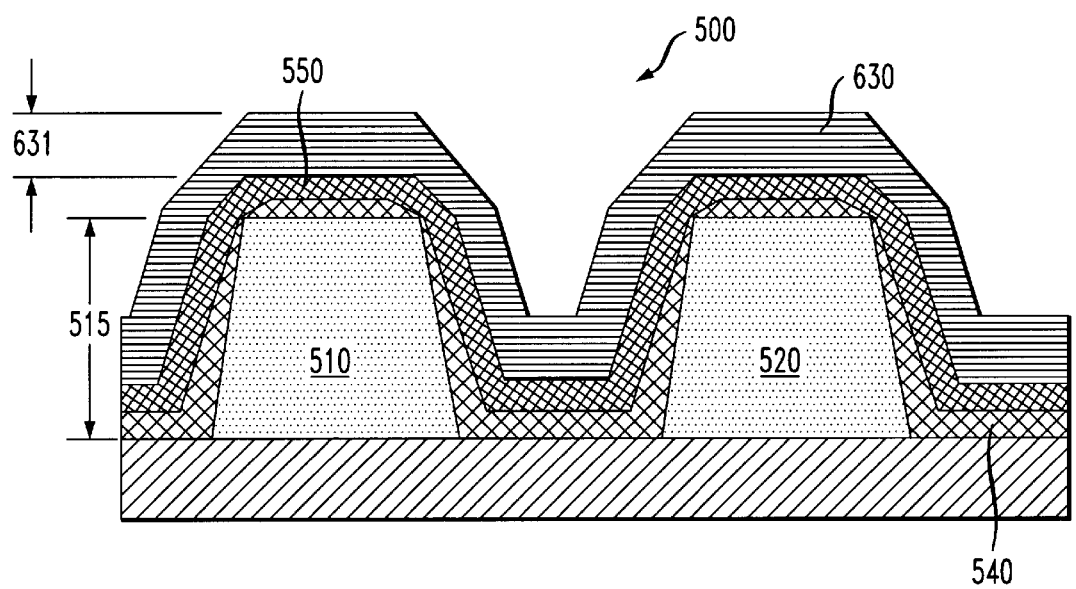
FIG. 6 illustrates a partial sectional view of the integrated circuit of FIG. 5 after deposition of a second oxide layer.

Referring now to FIG. 6 with continuing reference to FIG. 5, illustrated is a partial sectional view of the integrated circuit 500 of FIG. 5 after deposition of a second oxide layer 630. The second oxide layer 630 is formed on the third oxide layer 550 using a PECVD process. In a preferred embodiment, the process comprises an atmosphere of tetraethylorthosilicate and oxygen at a temperature of about 350° C. and a reactor pressure of about 4.0 Torr. Radiation is applied at about 13.56 MHz and 1200 Watts. The second oxide layer 630 is formed to a thickness 631 of about 1000 nm and has a refractive index of about 1.465 at $\lambda=633$ nm. This value of refractive index approximates the refractive index of an oxide film that will be deposited over at least a portion of the second oxide layer 630.

Figure 7:
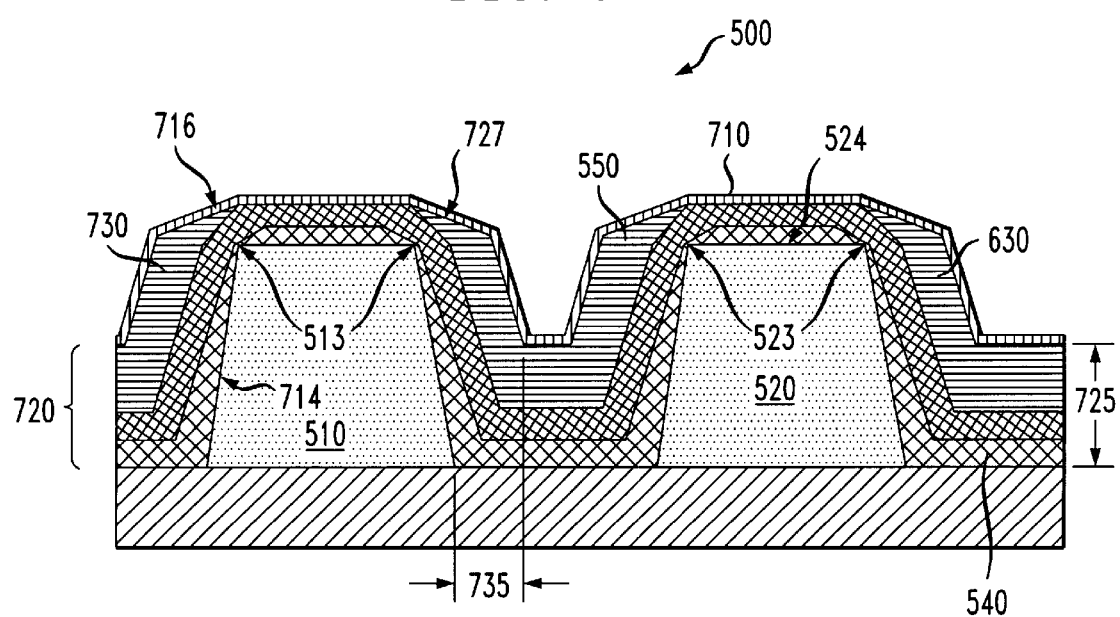
FIG. 7 illustrates a partial sectional view of the integrated circuit of FIG. 6 after a reactive ion etch and deposition of a capping layer.

Referring now to FIG. 7, illustrated is a partial sectional view of the integrated circuit 500 of FIG. 6 after a reactive ion etch and deposition of a capping layer 710. Oxide layers 540, 550, 630 are subjected to a reactive ion etch as described with reference to FIG. 4 above. This results in a composite oxide layer 720 that is the remnants of oxide layers 540, 550, and 630. Part of the composite oxide layer 720 is a spacer 730 that is principally a remnant of the PETEOS oxide layer, referred to as the second oxide layer 630. In one embodiment, a base 735 of the spacer 730 should range from about 40 percent to about 60 percent of the composite oxide layer thickness 725. In a preferred embodiment, the base 735 is about 50 percent of the composite oxide layer thickness 725.

Figure 1:
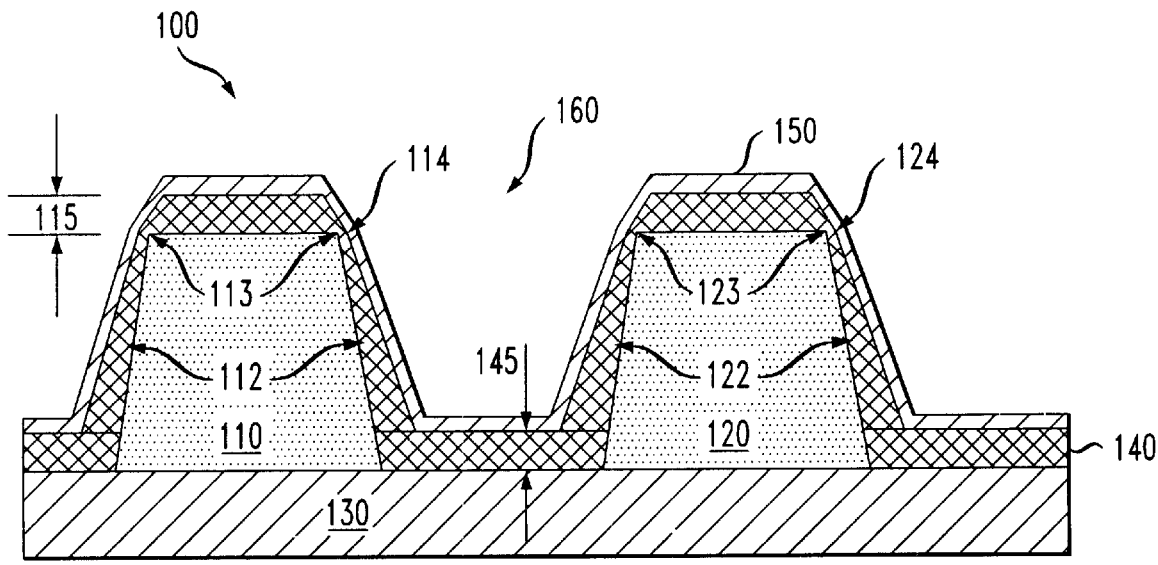
FIG. 1 illustrates a partial sectional view of a simplified conventional integrated circuit having thick metal features, an oxide layer deposited by HDP and a nitride layer.
Figure 2A:
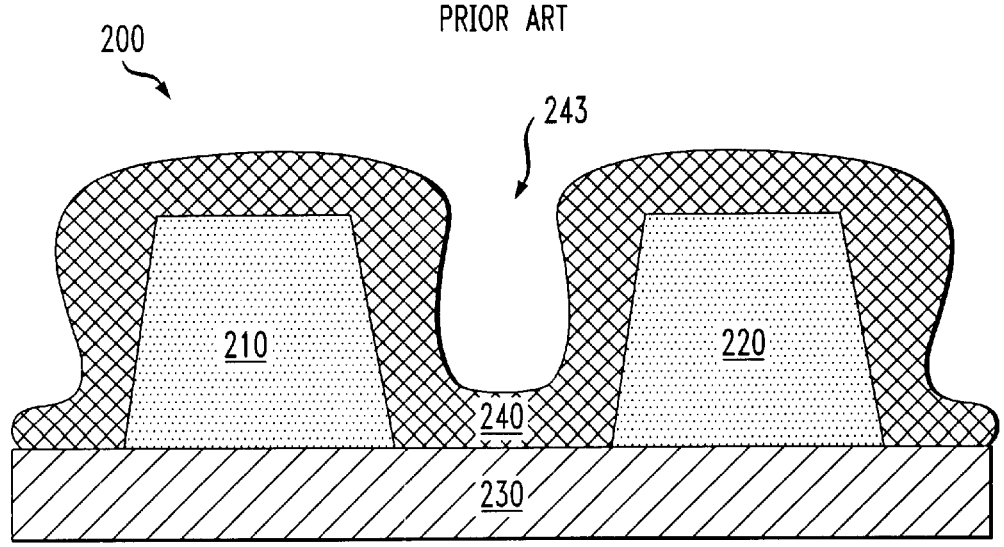
FIG. 2A illustrates a partial sectional view of a simplified conventional integrated circuit having thick metal features and an oxide layer deposited by PECVD containing a reentrant surface.
Figure 2B:
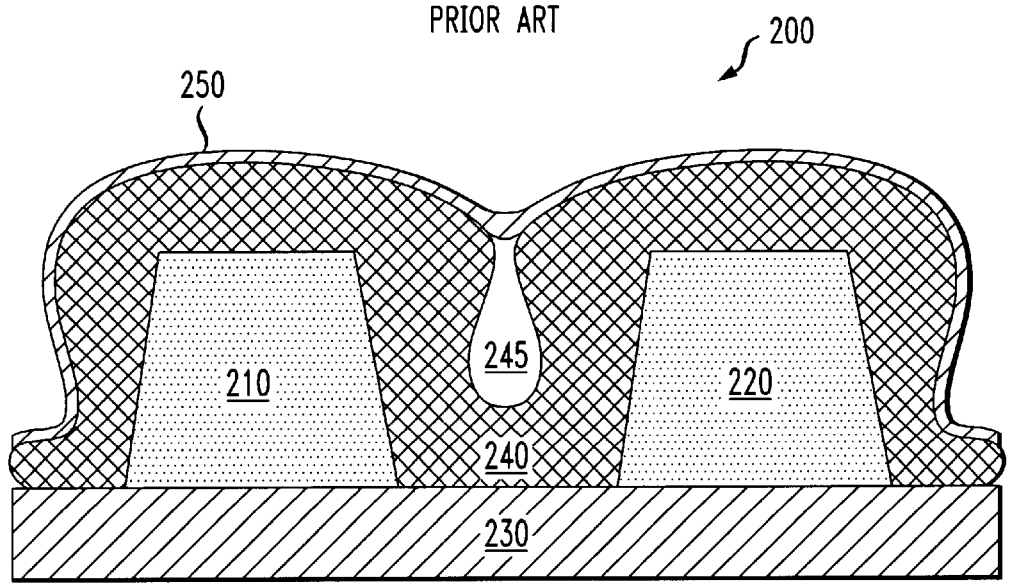
FIG. 2B illustrates a partial sectional view of a simplified conventional integrated circuit as in FIG. 2A having an oxide layer deposited by PECVD containing a void.

The composite oxide layer 720 has a surface 727 as shown. One should note the relative smoothness of the surface 727 as compared to the surfaces of FIGS. 1 and 2. Therefore, the capping layer 710 may be readily formed as a continuous layer on the composite oxide layer 720. In a preferred embodiment, the capping layer 710 is a nitride layer 710, formed using a PECVD nitride deposition. The film stress of the capping layer 710 may be tuned by the mix of low radio frequency power, e.g., 200 kHz, and high radio frequency power, e.g., 13.56 MHz The shoulder thickness 716 of the composite oxide layer 720 can be seen to be thicker and to have a smoother transition over the shoulder 513 than in the prior art as shown in FIGS. 1 and 2. Thus, oxide coverage over shoulders 513, 523 results in a smoother transition from an upper surface 524 to a side surface 714, providing better adherence of a nitride capping layer 710.

Figure 8:
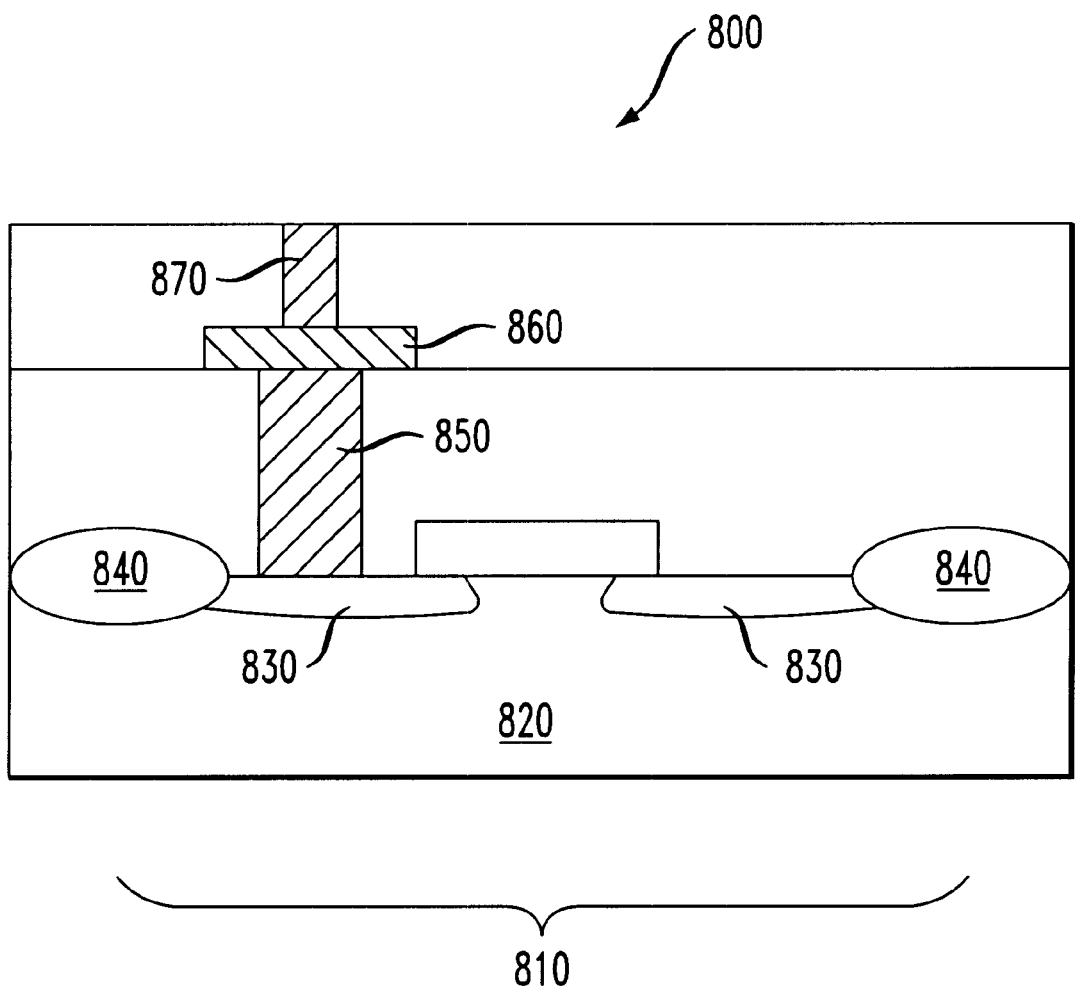
FIG. 8 illustrates a partial sectional view of a conventional integrated circuit that can be manufactured using a method in accordance with the principles of the present invention.

Referring now to FIG. 8, illustrated is a partial sectional view of a conventional integrated circuit 800 that can be manufactured using the method in accordance with the principles of the present invention. In this particular sectional view, there is illustrated an active device 810 that comprises a tub region 820, source/drain regions 830 and field oxides 840, which together may form a conventional transistor, such as a CMOS, PMOS, NMOS or bi-polar transistor. A contact plug 850 contacts the active device 810. The contact plug 850 is, in turn, contacted by a trace 860 that connects to other regions of the integrated circuit, which are not shown. A VIA 870 contacts the trace 860, which provides electrical connection to subsequent levels of the integrated circuit 800.

Thus, the present invention provides a method for forming a spacer of an oxide on the sides of a thick metal feature so that the oxide smooths the transition from the upper surface of the thick metal feature to the sides of the thick metal feature. The formation of the spacer facilitates subsequent formation of a capping layer over the oxide layer. Additionally, the present invention also addresses forming an uppermost layer of the oxide so as to have a refractive index approximately equal to that of the capping layer that will be formed, thereby minimizing interlayer stresses.

Although the present invention has been described in detail, those skilled in the art should understand that they can make various changes, substitutions and alterations herein without departing from the spirit and scope of the invention in its broadest form.

What is claimed is:

1. A method of capping a metal feature of an integrated circuit, comprising:
   forming a first oxide layer over the metal feature using a high density plasma (HDP) process;
   forming a second oxide layer over the first oxide layer using a plasma enhanced chemical vapor desposition (PECVD) process;
   forming a composite oxide layer including an oxide spacer by etching the first and second oxide layers; and
   forming a capping layer over the composite oxide layer.

2. The method as recited in claim 1 wherein forming a first oxide layer includes forming a first oxide layer using an HDP process having a first deposition-to-sputter ratio.

3. The method as recited in claim 2 wherein forming a first oxide layer includes forming a first oxide layer using a first deposition-to-sputter ratio of about 4.5.

4. The method as recited in claim 2 further comprising forming a third oxide layer on the first oxide layer and prior to forming the second oxide layer using a second HDP process having a second deposition-to-sputter ratio.

5. The method as recited in claim 4 wherein forming a third oxide layer includes forming a third oxide layer using a second deposition-to-sputter ratio of about 7.0.

6. The method as recited in claim 4 wherein forming a first oxide layer includes forming a first oxide layer of about 400 nm thickness and forming a third oxide layer includes forming a third oxide layer of about 400 nm thickness.

7. The method as recited in claim 1 wherein forming a second oxide layer includes forming a second oxide layer from a gas mixture including tetraethylorthosilicate and oxygen at a temperature ranging from about 250° C. to about 400° C., a pressure ranging from about 0.1 Torr to about 10.0 Torr and high frequency radiation ranging from about 200 kHz to about 13.56 MHz with a power ranging from about 100 Watts to about 1000 Watts.

8. The method as recited in claim 7 wherein forming a second oxide layer includes forming a second oxide layer at a temperature of about 350° C., a pressure of about 4.0 Torr, and high frequency radiation of about 13.56 MHz with a power of about 1200 watts.

9. The method as recited in claim 1 wherein forming an oxide spacer includes forming an oxide spacer having a base thickness ranging from about 40 percent to 60 percent of the thickness of the composite oxide layer.

10. The method as recited in claim 9 wherein forming an oxide spacer having a base thickness includes forming an oxide spacer having a base thickness of about 50 percent of the thickness of the composite oxide layer.

11. The method as recited in claim 1 wherein etching includes etching with a gas mixture of trifluoromethane ranging from about 10 sccm to about 50 sccm, carbon tetrafluoride ranging from about 10 sccm to about 50 sccm, and argon ranging from about 50 sccm to about 250 sccm at a pressure ranging from about 50 mTorr to about 200 mTorr, a power ranging from about 600 Watts to about 1200 Watts, and a magnetic field ranging from about 0 Gauss to about 40 Gauss.

12. The method as recited in claim 11 wherein etching includes etching with a gas mixture of trifluoromethane at about 30 sccm, carbon tetrafluoride at about 30 sccm, and argon at about 60 sccm at a pressure of about 160 mTorr, a power of about 900 Watts, and a magnetic field of about 20 Gauss.

13. The method as recited in claim 1 wherein forming a capping layer includes forming a silicon nitride layer using a PECVD process.

14. The method as recited in claim 1 wherein forming a second oxide layer includes forming a second oxide layer having a refractive index of about 1.465 at $\lambda=633$ nm.

15. The method as recited in claim 1 wherein the metal feature is about 3000 nm thick.

16. A method of manufacturing an integrated circuit, comprising:
   forming an active device on a semiconductor wafer;
   forming a dielectric layer over the active device;
   forming a metal feature over the dielectric layer and electrically connecting the metal feature to the active device; and
   capping the metal feature, comprising:
      forming a first oxide layer over the metal feature using a high density plasma (HDP) process;
      forming a second oxide layer over the first oxide layer using a plasma enhanced chemical vapor deposition (PECVD) process;
      forming a composite oxide layer including an oxide spacer by etching the first and second oxide layers; and
      forming a capping layer over the composite oxide layer.

17. The method as recited in claim 16 wherein forming a first oxide layer includes forming a first oxide layer using an HDP process having a first deposition-to-sputter ratio.

18. The method as recited in claim 17 wherein forming a first oxide layer includes forming a first oxide layer using a first deposition-to-sputter ratio of about 4.5.

19. The method as recited in claim 17 further comprising forming a third oxide layer over the first oxide layer and prior to forming the second oxide layer using a second HDP process having a second deposition-to-sputter ratio.

20. The method as recited in claim 19 wherein forming a third oxide layer includes forming a third oxide layer using a second deposition-to-sputter ratio of about 7.0.

21. The method as recited in claim 19 wherein forming a first oxide layer includes forming a first oxide layer of about 400 nm thickness and forming a third oxide layer includes forming a third oxide layer of about 400 nm thickness.

22. The method as recited in claim 16 wherein forming a second oxide layer includes forming a second oxide layer from a gas mixture including tetraethylorthosilicate and oxygen at a temperature ranging from about 200° C. to about 400° C., a pressure ranging from about 0.1 Torr to about 10.0 Torr and high frequency radiation ranging from about 200 kHz to about 13.56 MHz and from about 100 watts to about 2000 watts.

23. The method as recited in claim 22 wherein forming a second oxide layer includes forming a second oxide layer at a temperature of about 350° C., a pressure of about 4.0 Torr, and high frequency radiation of about 13.56 MHz at about 1200 watts.

24. The method as recited in claim 16 wherein forming an oxide spacer includes forming an oxide spacer having a base thickness ranging from about 40 percent to about 60 percent of the thickness of the composite oxide layer.

25. The method as recited in claim 24 wherein forming an oxide spacer having a base thickness includes forming an oxide spacer having a base thickness of about 50 percent of the thickness of the composite oxide layer.

26. The method as recited in claim 16 wherein etching includes etching with a gas mixture of trifluoromethane ranging from about 10 sccm to about 50 sccm, carbon tetrafluoride ranging from about 10 sccm to about 50 sccm, and argon ranging from about 50 sccm to about 250 sccm at a pressure ranging from about 50 mTorr to about 200 mTorr, a power ranging from about 600 Watts to about 1200 Watts, and a magnetic field ranging from about 0 Gauss to about 40 Gauss.

27. The method as recited in claim 26 wherein etching includes etching with a gas mixture of trifluoromethane at about 30 sccm, carbon tetrafluoride at about 30 sccm, and argon at about 60 sccm at a pressure of about 160 mTorr, a power of about 900 Watts, and a magnetic field of about 20 Gauss.

28. The method as recited in claim 16 wherein forming a capping layer includes forming a silicon nitride layer using a PECVD process.

29. The method as recited in claim 16 wherein forming a second oxide layer includes forming a second oxide layer having a refractive index of about 1.465 at $\lambda=633$ nm.

30. The method as recited in claim 16 wherein the metal feature is about 3000 nm thick.

* * * * *